(12) United States Patent
Ziberna

(10) Patent No.: US 6,247,227 B1
(45) Date of Patent: Jun. 19, 2001

(54) APPARATUS FOR ASSEMBLING PARTS IN A CARRIER STRIP

(75) Inventor: Frank J. Ziberna, Elmhurst, IL (US)

(73) Assignee: Dial Tool Industries, Addison, IL (US)

( * ) Notice: Subject to any disclaimer, the term of this patent is extended or adjusted under 35 U.S.C. 154(b) by 0 days.

(21) Appl. No.: 09/339,763

(22) Filed: Jun. 24, 1999

Related U.S. Application Data

(62) Division of application No. 08/692,009, filed on Aug. 2, 1996, now Pat. No. 5,938,038.

(51) Int. Cl.⁷ .............................. B23P 21/00; B23P 19/00
(52) U.S. Cl. .................................. 29/786; 29/822; 29/819
(58) Field of Search .............................. 29/412, 418, 423, 29/819, 822, 786, 793

(56) References Cited

U.S. PATENT DOCUMENTS

| | | | |
|---|---|---|---|
| 2,659,406 | * 11/1953 | Locke . | |
| 2,917,678 | * 12/1959 | Tepper . | |
| 3,172,198 | * 3/1965 | Rulf | 29/416 |
| 3,331,497 | 7/1967 | Lunsford | 206/56 |
| 3,339,719 | 9/1967 | Bush | 206/56 |
| 3,417,865 | 12/1968 | Suverkropp et al. | 206/46 |
| 3,447,229 | * 6/1969 | Clark . | |
| 3,490,134 | * 1/1970 | Bisschop . | |
| 3,512,438 | 5/1970 | Burdge | 83/209 |
| 3,517,803 | 6/1970 | Frompovicz et al. | 206/56 |
| 3,523,608 | 8/1970 | Miller | 206/65 |
| 3,574,929 | * 4/1971 | Michik . | |
| 3,588,990 | * 6/1971 | Klaus et al. . | |
| 3,691,601 | * 9/1972 | Hough | 29/412 |
| 3,698,074 | 10/1972 | Helda et al. | 29/626 |
| 3,727,752 | * 4/1973 | Poupitch . | |
| 3,797,655 | 3/1974 | Boone et al. | 206/330 |
| 3,858,721 | 1/1975 | Boyer et al. | 206/330 |
| 3,885,669 | * 5/1975 | Potucek . | |
| 3,913,195 | 10/1975 | Beaver | 29/25.35 |
| 4,012,835 | 3/1977 | Wallick | 29/591 |
| 4,118,859 | 10/1978 | Busler | 29/622 |
| 4,180,161 | 12/1979 | Henrickson et al. | 206/328 |
| 4,195,193 | 3/1980 | Grabbe et al. | 174/52 |
| 4,242,535 | * 12/1980 | Defibaugh et al. . | |
| 4,295,117 | 10/1981 | Lake et al. | 338/4 |
| 4,389,764 | * 6/1983 | Flander et al. | 29/412 |
| 4,401,053 | 8/1983 | Riley | 118/721 |
| 4,404,742 | * 9/1983 | Fuhrmeister | 29/798 |
| 4,418,815 | 12/1983 | Anderson et al. | 198/476 |
| 4,438,847 | 3/1984 | Fritz | 206/330 |
| 4,445,736 | * 5/1984 | Hopkins | 29/883 |
| 4,451,973 | 6/1984 | Tateno et al. | 29/588 |
| 4,483,441 | 11/1984 | Akizawa et al. | 206/328 |
| 4,571,662 | * 2/1986 | Conquest et al. . | |
| 4,583,641 | 4/1986 | Gelzer | 206/330 |

(List continued on next page.)

OTHER PUBLICATIONS

Two photographs of device entitled, "Continuous Belt". Photograph a tape having a series of pockets, each of which includes a part therein. An adhesive–backed cover strip covers the pockets to seal the parts therein.

*Primary Examiner*—S. Thomas Hughes
*Assistant Examiner*—Marc Jimenez
(74) *Attorney, Agent, or Firm*—Marshall, O'Toole, Gerstein, Murray & Borun

(57) ABSTRACT

A die apparatus for assembling a part carried by a part strip onto a carrier strip is disclosed. The die apparatus includes a die housing defining an assembly station, with a portion of the die housing including a punch generally aligned with the assembly station. A part strip conveyor is provided and is adapted to convey the part strip to a position adjacent the assembly station, while a carrier strip conveyor is also provided and is adapted to convey the carrier strip to a position aligned with the assembly station. Accordingly, upon operation of the punch a part is separated from the part strip and inserted into a part receiving aperture of the carrier strip during a single punch stroke.

16 Claims, 5 Drawing Sheets

U.S. PATENT DOCUMENTS

| | | | |
|---|---|---|---|
| 4,600,971 | 7/1986 | Rose et al. | 361/421 |
| 4,611,262 | 9/1986 | Galloway et al. | 361/421 |
| 4,621,486 | 11/1986 | Slavicek | 53/580 |
| 4,631,897 | 12/1986 | Slavicek | 53/399 |
| 4,633,370 | 12/1986 | Hamuro et al. | 361/380 |
| 4,633,582 | 1/1987 | Ching et al. | 29/827 |
| 4,706,811 | 11/1987 | Jung et al. | 206/331 |
| 4,712,675 | 12/1987 | Scholten et al. | 206/332 |
| 4,756,193 | 7/1988 | Luettgen | 73/756 |
| 4,757,895 | 7/1988 | Gelzer | 206/330 |
| 4,767,984 | 8/1988 | Bakker | 324/158 F |
| 4,781,953 | 11/1988 | Ball | 428/35 |
| 4,850,227 | 7/1989 | Luettgen et al. | 73/708 |
| 4,984,319 * | 1/1991 | Reynolds . | |
| 5,027,505 * | 7/1991 | Nakamura et al. | 29/412 |
| 5,085,362 | 2/1992 | Art et al. | 228/49.1 |
| 5,090,103 * | 2/1992 | Nakata et al. | 29/418 |
| 5,119,934 | 6/1992 | Karasawa et al. | 206/330 |
| 5,263,241 | 11/1993 | Hart, Jr. et. al. | 29/827 |
| 5,312,015 | 5/1994 | Gelzer | 221/72 |
| 5,361,901 | 11/1994 | Schenz et al. | 206/330 |
| 5,394,675 | 3/1995 | Yonehara | 53/410 |
| 5,472,085 | 12/1995 | Gelzer | 206/714 |
| 5,483,857 | 1/1996 | Ziberna | 83/104 |
| 5,524,765 | 6/1996 | Gutentag | 206/713 |
| 5,530,204 | 6/1996 | Kondo et al. | 174/52.4 |
| 5,546,657 * | 8/1996 | Mehta et al. | 29/884 |
| 5,579,574 * | 12/1996 | Colleran et al. | 29/840 |
| 5,682,663 * | 11/1997 | Derksen | 29/419 |
| 5,690,233 | 11/1997 | Kaneko | 206/714 |
| 5,763,829 | 6/1998 | Tomita et al. | 174/52.2 |
| 5,967,328 * | 10/1999 | Ziberna . | |
| 6,016,918 * | 1/2000 | Ziberna . | |

* cited by examiner

APPARATUS FOR ASSEMBLING PARTS IN A CARRIER STRIP

STATEMENT REGARDING RELATED APPLICATIONS

This application is a Divisional of application Ser. No. 08/692,009, filed Aug. 2, 1996, now U.S. Pat. No. 5,938,038.

TECHNICAL FIELD

The present invention relates generally to the supply of parts, and more particularly to a carrier strip for carrying parts and an apparatus for assembling parts therein.

BACKGROUND ART

Many machines for trimming workpieces from a supply of workpieces are known. These machines include conventional punch presses in which a reciprocating cutting punch or die sequentially contacts a supply feedstock to separate a workpiece therefrom. Other machines may include trimming machines which trim an individual part or workpiece from a connecting member interconnecting a plurality of such workpieces, such as a strip or other carrier item. In these machines, the supply feedstock may consist of a coil of sheet metal in which individual workpieces have been previously stamped and formed. Yet other machines, such as that described in U.S. Pat. No. 3,512,438, utilize a strip of feedstock which is fed into the punch press and acted upon thereby to form the feedstock into a predetermined configuration along the entire length thereof. Individual workpieces are subsequently trimmed from the feedstock as a further finishing step.

In the manufacture of a variety of electronic and other components, robotic loaders or other automated assembly devices are used more frequently to achieve better production line efficiencies. Such automated assembly devices pick up individual parts or workpieces from a predesignated location and insert the part into a portion of the component. Such automated assembly devices are commonly used in the construction of electronic circuit boards. These automated devices may include, for example, an arm which moves along a designated path to a predesignated location where the arm picks up an individual workpiece and inserts it in place onto a production line component, such as a circuit board, where it is subsequently soldered or otherwise attached thereto by another automated device. In order to maintain production line efficiencies, the robotic devices must have individual workpieces consistently presented to them in a predesignated orientation and at a predesignated location. Deviation from either the predesignated orientation or location may result in the automated device not engaging the workpiece and inserting it into the production line component.

Many of the workpieces or parts used in such automated production lines are delicate in nature because they are stamped and formed from thin sheet metal prior to being presented to an automated assembly device. The stamping and forming of the workpiece typically occurs away from the automated production line. Robotic assemblers utilize "carrier strips," "carrier tapes" or trays to feed parts thereto. One such type of carrier tape is known as "debossed tape and reel" and consists of a plastic carrier tape with a plurality of recessed pockets or openings formed therein along the longitudinal extent of the tape. A part is placed in each of the pockets and a plastic sealing tape or bonding tape is adhesively applied to the carrier tape, thereby sealing the parts in respective pockets. The carrier tape is fed into a robotic assembler and the seal tape is peeled away and the part removed and installed. Both the seal tape and the carrier tape are then discharged to waste by the robot. Examples of such constructions are described in U.S. Pat. Nos. 4,712,675 and 4,781,953. However, human insertion of the parts into the pockets is often required and the two-part nature of the debossed tape is expensive. Additionally, a specific orientation of the parts in the pocket must also be maintained for pick-up by the robot loader.

Another type of carrier type is known by the tradename of "GPAX" and is described in U.S. Pat. Nos. 4,583,641 and 4,757,895. In a GPAX-type structure, a carrier tape is provided with a plurality of holes and intervening slots punched into it along the longitudinal extent thereof. The holes are adapted to engage legs or stubs of each electrical part to insure proper and secure positioning of the part on the tape. A plastic bonding tape overlays the carrier tape and parts and is pressed or stitched into the carrier tape between adjacent parts. This bonding tape offers protection to the parts and retains the parts in place on the carrier tape. This type of carrier tape construction shares certain disadvantages with the debossed tape and reel construction previously described. For example, the assembled tapes are composed of multiple pieces and thus increases the amount of waste generated by the process.

Ziberna U.S. Pat. No. 5,483,857 discloses a work piece finishing and presentation machine including means for mounting a supply of interconnected work pieces in the form of a continuous belt, means for engaging and feeding the continuous belt, means for trimming individual work pieces from the belt and means for receiving an individual work piece and for presenting same to a robotic loader or assembler.

SUMMARY OF THE INVENTION

According to one aspect of the present invention, a parts carrier comprises a flexible member which can be flattened into a planar strip and having a plurality of part-receiving apertures extending fully therethrough. Each aperture is defined by walls including a tab portion which is resiliently deflectable from an undeflected position while the flexible member is flattened to permit placement of a preformed part in a part-receiving aperture, and which thereafter returns to substantially the undeflected position to releasably engage a recess in the part. Preferably, the tab portions are coplanar and the walls defining each aperture may include four portions wherein each wall portion may include two tab portions. Still further in accordance with the preferred embodiment, each aperture may be rectangular.

Also, the flexible member may include a series of positioning holes. In accordance with a specific embodiment, first and second series of marginal positioning holes are disposed on first and second sides, respectively, of the apertures. In addition, each series of marginal positioning holes may include a first set of spaced holes each of a first size and a second set of spaced holes interspersed between the first set of spaced holes and each of a second size smaller than the first size. Also, the apertures and the positioning holes may be regularly spaced. In accordance with a further aspect of the present invention, a combination includes a flexible planar strip having a plurality of part-receiving apertures extending fully through the strip wherein each aperture is defined by walls including tab portions which are deflectable when the strip is flattened to releasably engage a recess in a part. The strip further includes a series of positioning holes adjacent the apertures. A plurality of parts are disposed in the plurality of apertures wherein each part has a recess which receives one of the tab portions.

In accordance with yet another aspect of the present invention, apparatus for assembling a part carried by a parts strip into a carrier strip includes first means for conveying the parts strip along a first path to deliver the part to an assembly station and second means for conveying the carrier strip along a second path transverse to the first path to position a part-receiving aperture in the carrier strip at the assembly station. A punch is operative when the part is aligned with the part-receiving aperture at the assembly station for separating the part from the parts strip and placing the part into the part-receiving aperture during a single punch stroke.

These and other features of the present invention will become apparent from a reading of the following detailed description.

BRIEF DESCRIPTION OF THE DRAWINGS

In the course of the following detailed description, reference will be made to the attached drawings wherein like reference numerals identify like parts and wherein:

FIG. 5 is a partial sectional view taken generally along the lines 5—5 of. FIG. 2 when the die is fully closed.

DESCRIPTION OF THE PREFERRED EMBODIMENTS

Figure 1:
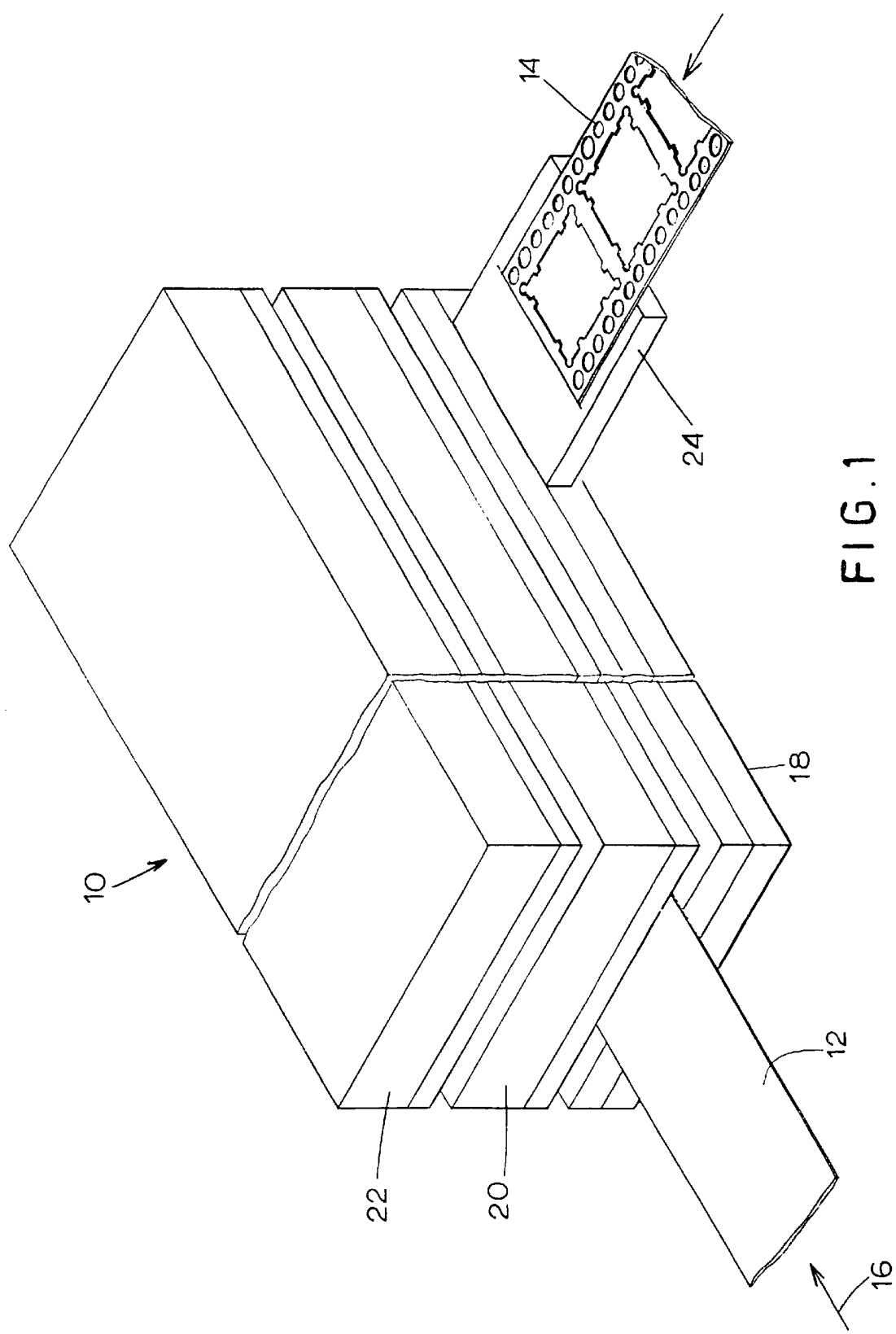
FIG. 1 is a fragmentary, isometric and diagrammatic view of a die for assembling a part into a carrier strip according to the present invention.

Referring now to FIG. 1, a die 10 forms parts in a metal strip 12 and assembles the parts into a parts carrier strip 14 fabricated of plastic or other suitable flexible material. The metal strip 12 is fed in the direction of an arrow 16 into a space between lower and intermediate die portions 18, 20, respectively. The die 10 further includes an upper portion 22 which is slidably connected to the intermediate die portion 20. The die portions, 18, 20 and 22 are interconnected by guides (not shown) which allow reciprocating movement of the intermediate die portion 20 and the upper die portion 22 relative to the lower die portion 18.

Preferably, the carrier strip is fabricated of polypropylene or any other suitable plastic or other material and is two inches wide and 0.020 inches thick. The carrier strip 14 may be fed by any suitable means, and, in the preferred embodiment is fed into the die by an air-operated feeding device 24 which may comprise, for example, a model B4 feeder manufactured by Rapid Air Corporation of Rockford, Ill.

Figure 2:
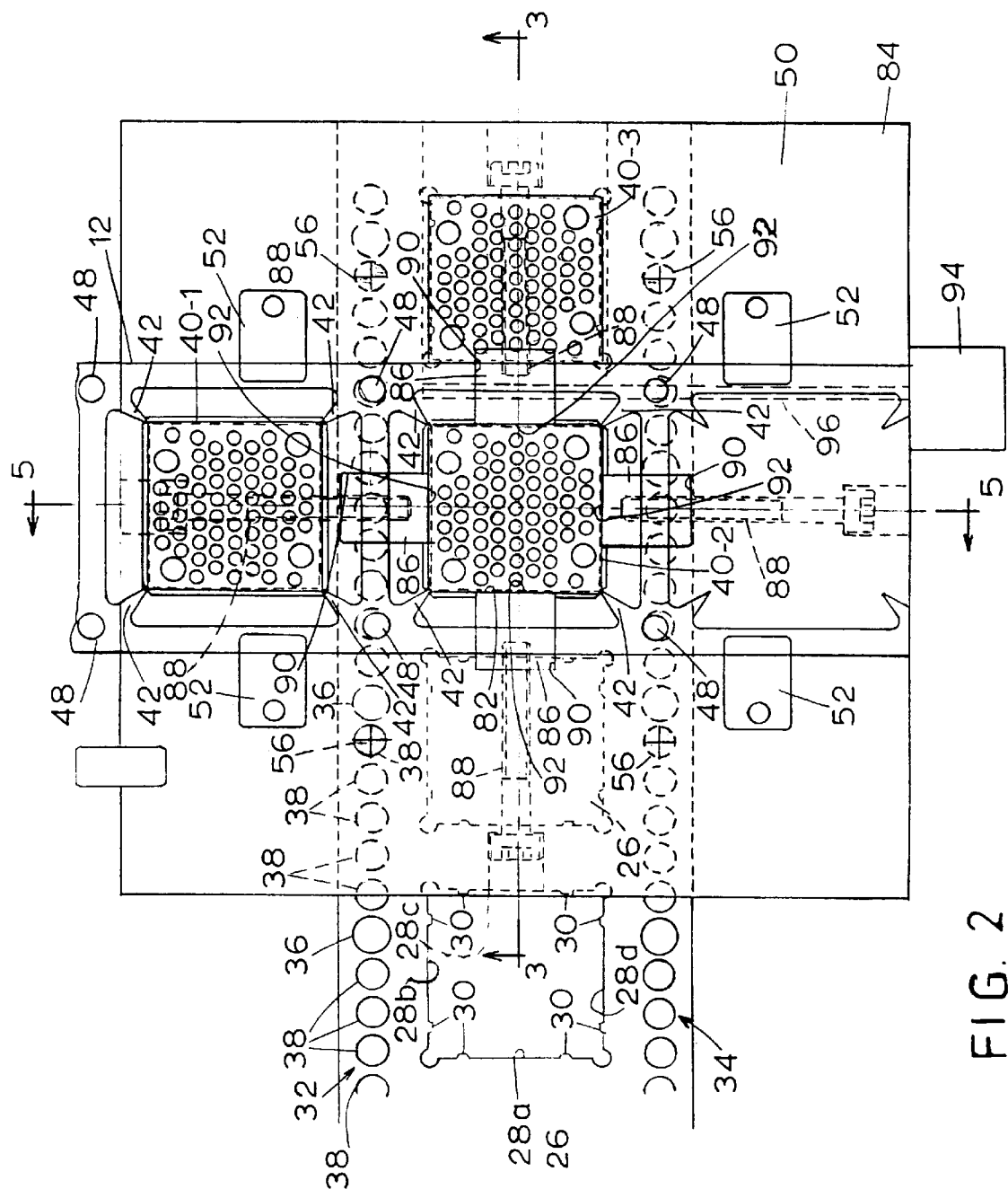
FIG. 2 comprises a plan view of a lower portion of an assembly station of the die of FIG. 1.

As seen in FIG. 2, the carrier strip 14 is generally planar and includes a plurality of part-receiving apertures 26. Preferably, although not necessarily, each aperture 26 is generally rectangular and, more particularly, is generally square. In the illustrated embodiment, each aperture 26 includes four wall portions 28a–28d and each wall portion 28a 28d includes two planar tab portions 30 which are spaced from one another near outer ends of the wall portions 28a–28d. If necessary or desirable, the number and/or placement of tab portions 30 may be varied in dependence upon the size and shape of the part to be carried in the aperture 26.

Each tab portion 30 is resiliently deflectable from an undeflected position while the carrier strip 14 is flattened.

First and second series of marginal positioning holes 32, 34 are located on either side of the apertures 26 inside of guide edges of the strip 14. Preferably, the holes of each series 32, 34 are regularly spaced. Also preferably, each series of holes 32, 34, for example, the series 32, includes a first set of spaced holes 36 each of a first size and a second set of spaced holes 38 interspersed between the first set of spaced holes 36 wherein each hole of the second set is of a second size smaller than the first size. Each hole of the second set of holes 38 is precisely located with respect to the apertures 26 to permit accurate placement of the carrier strip 14 during insertion of a part therein. The second set of holes 36 are larger to permit pickoff apparatus (not shown) to accurately position each part during a subsequent assembly process. If a different methodology is to be used to accurately position the parts carried by the strip during the subsequent assembly process, then the use of differently sized holes 36 and 38 may be dispensed with.

Figure 3:
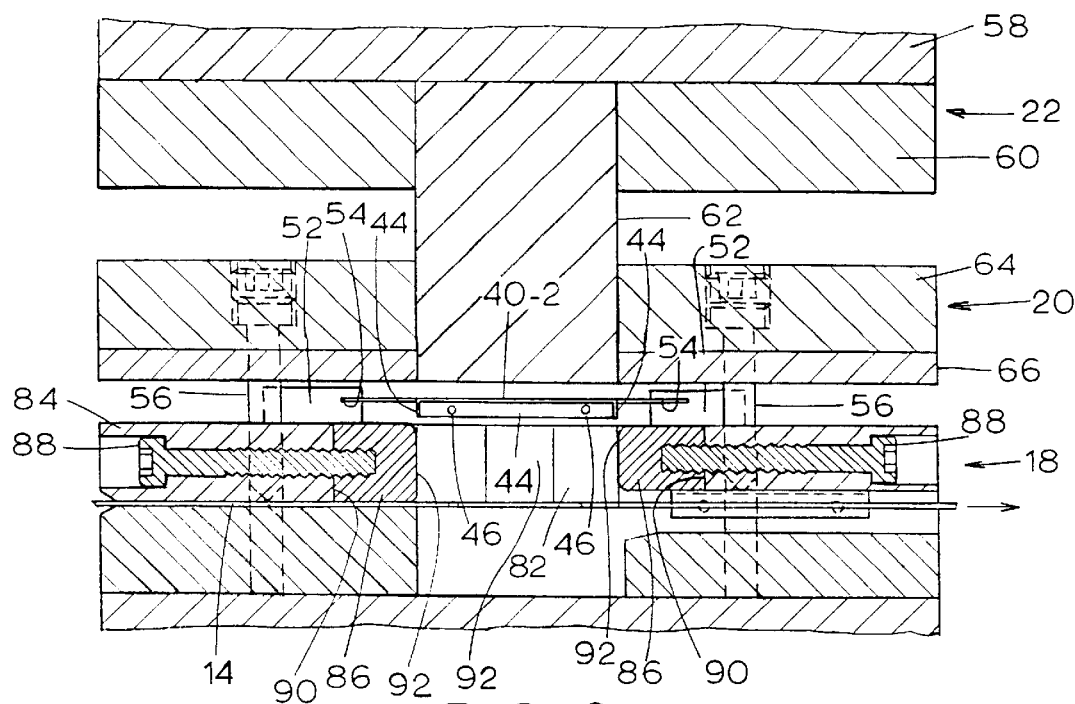
FIG. 3 is a sectional view taken generally along the lines 3—3 of FIG. 2 when the die is fully open.

Referring again to FIG. 1, the die 10 includes a series of forming stations (not shown) which sequentially stamp the metal strip 12 into parts 40, three of which 40-1. 40-2 and 40-3 are shown in FIG. 2. The parts 40-1 and 40-2 are connected to the balance of the strip 12 by arms 42 which remain after punching of the metal strip 12. As seen in FIG. 3, each part, for example the part 40-2, includes four downwardly depending walls 44, each of which includes a pair of recesses in the form of holes 46. The spacing between the holes 46 is equal to the spacing between the tabs 30 of the wall portions 28a–28d defining the apertures 26. The metal strip 12 may further include positioning holes 48, if desired.

Figure 6:
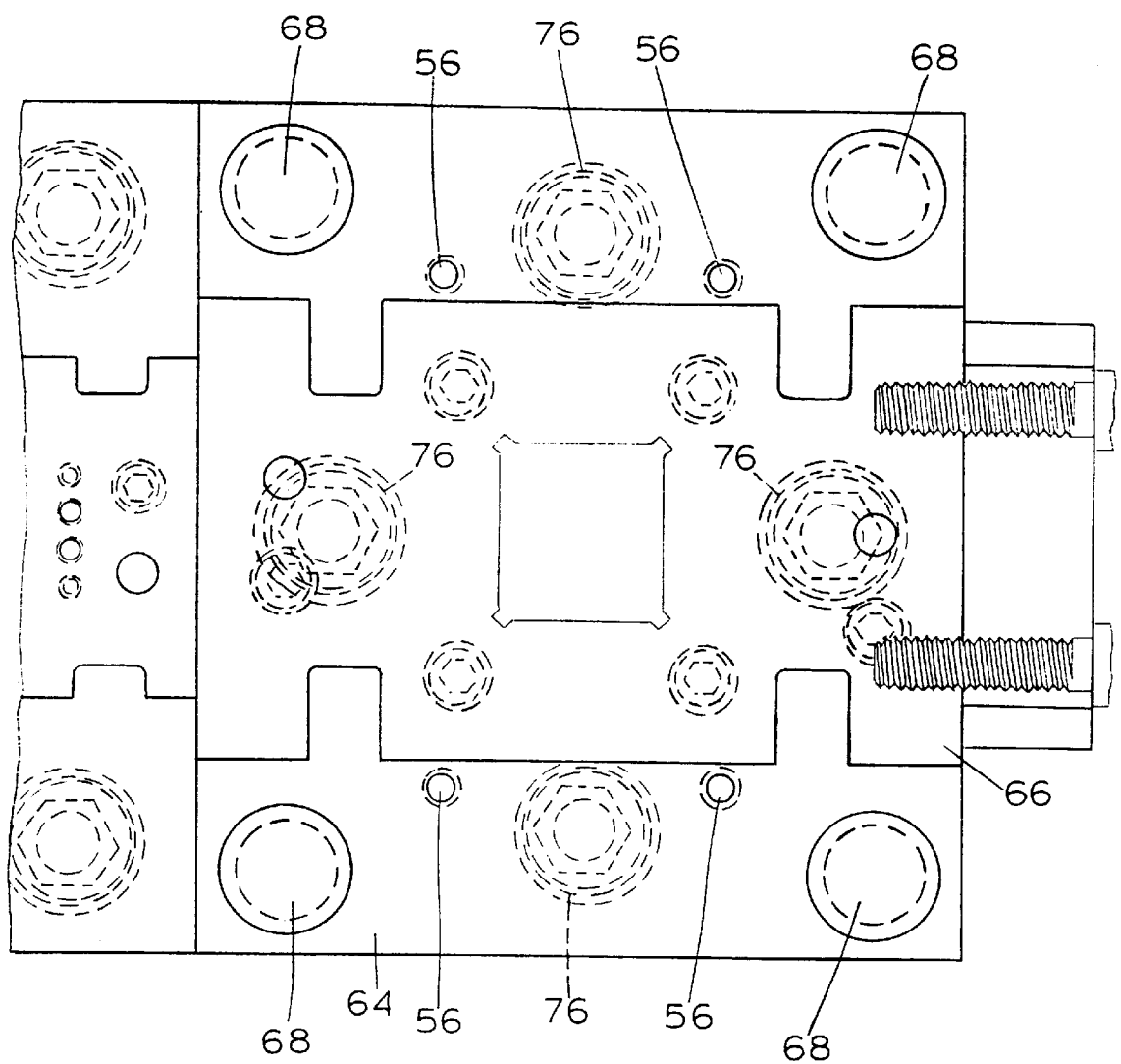
FIG. 6 is a bottom elevational view of the top of the assembly station of FIG. 1.

FIGS. 2 and 6 illustrate an assembly station 50 at which the metal strip 12 and the carrier strip 14 are fed along paths that extend transversely, and preferably perpendicularly, to each other. More particularly, with reference to FIGS. 2 and 3, the metal strip 12 is fed by a feeder (not shown) and is guided along a path by spring-loaded stock lifter guides 52 each of which, as seen in FIG. 3, includes a channel 54 therein. During operation of the die 10, the metal strip 12 is moved to a position such that a part 40, for example the part 40-2, is moved to the position showing in FIG. 2. Accurate placement of the part 40-2 at such location is assured by the placement of guides (not shown) into holes 48 upstream of the locations shown in FIG. 2. The plastic carrier strip 40 is similarly moved by the feeding device 24 such that an aperture 26 is placed in the position shown in FIG. 2. Accurate positioning of the carrier strip 14 is assured by pilots 56 which, as noted in greater detail below, lower into certain ones of the marginal positioning holes 32 and 34.

FIG. 3 illustrates the various parts of the die 10, the metal strip 12 and the carrier strip 14 during the time that the die 10 is open. As seen in FIG. 3, the upper die portion 22 includes a die set top 58 and a punch holder 60 which is screwed and dowelled to the die set top 58. A punch 62 preferably having a cross-sectional shape and size substantially the same as each part 40 is carried by the punch holder 60.

Figure 5:
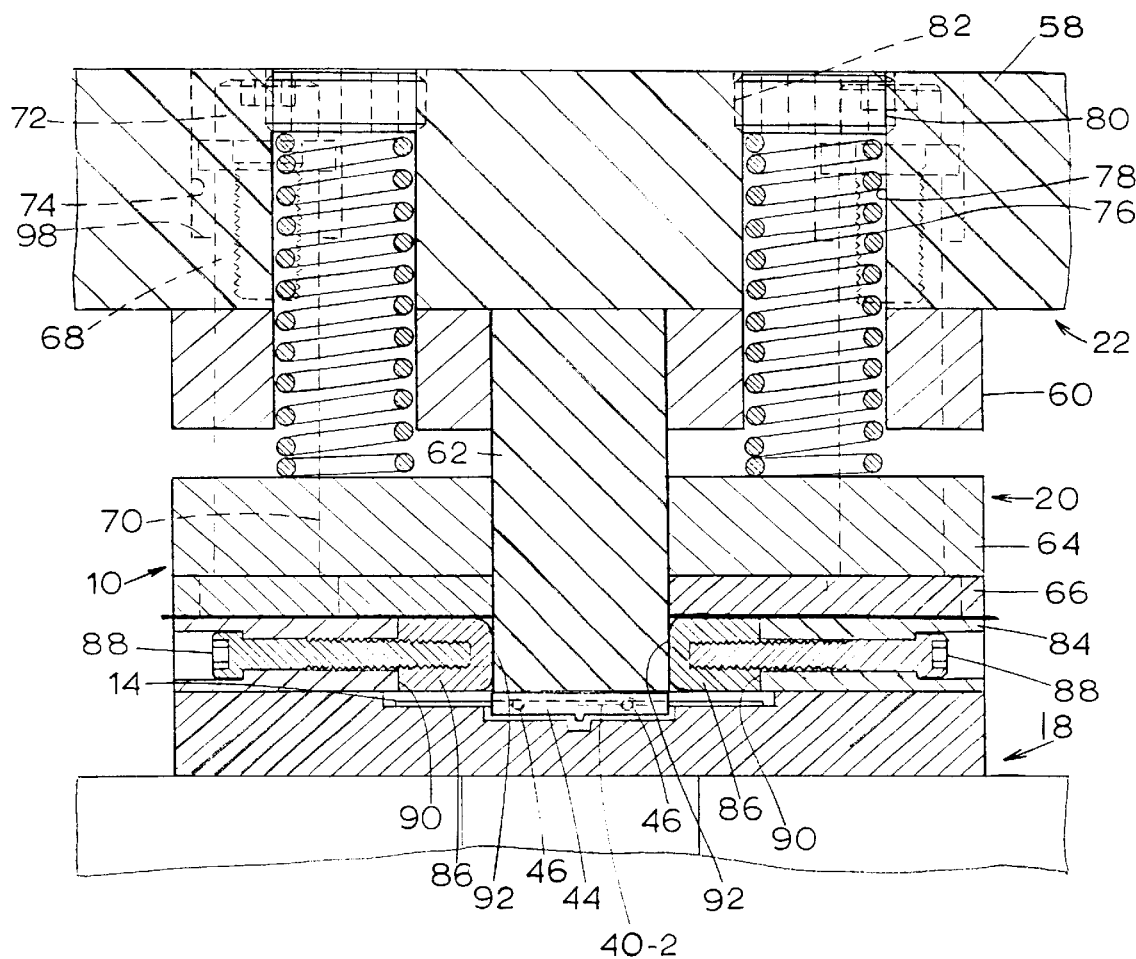

The intermediate die portion 20 includes a stripper 64 which carries a face plate 66. The face place 66 is made of a relatively hard material to resist wear and is secured to the stripper 64 by any convenient means, such as by screws and dowels. With reference to FIGS. 5 and 6, four sub-liner pins 68 extend through the punch holder 60 and include ends which are press fitted into bores in the stripper 64. The sub-liner pins further include enlarged heads 72 which are disposed within recesses 74. A pair of springs 76 are disposed in spring recesses 78 and are placed in compression between threaded plugs 80 and the stripper 64.

Once the metal strip 12 is moved to the position shown in FIG. 2, the part 40-2 is in alignment with a recess 82 formed in a die block 84 of the lower die portion 18. The recess 82 has a shape and size which is slightly larger than the outline of each part 40. Four guides or locators 86 are mounted by bolts 88 in side recesses 90 adjacent the recess 82. Leading edges 92 of the locators 86 are shaped complementary to outer edges of each part 40 (in the illustrated example the surfaces 92 are planar) and the positions of the leading edges 92 are adjusted so that an opening is formed which is substantially the same size as the outer dimensions of the part 40.

Figure 4:
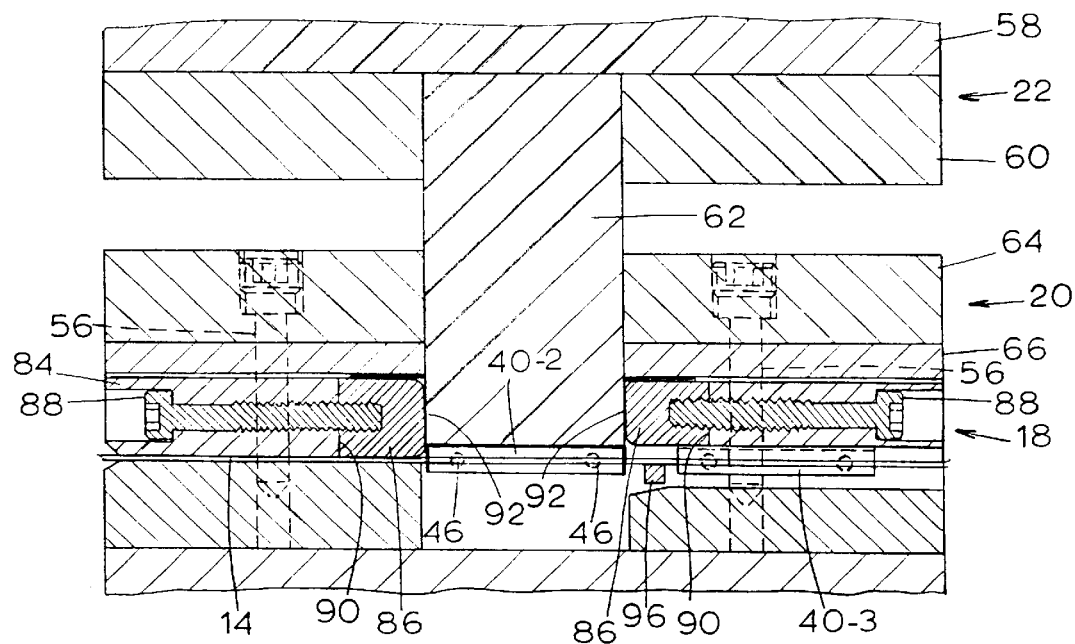
FIG. 4 is a view similar to FIG. 3 with the die fully closed.

Once the metal strip 12 and the carrier strip 14 are precisely located at the positions shown in FIG. 2, the upper die portion 22 is lowered. Initially, the die set top, the punch holder 60 and punch 62 as well as the stripper 64 and the face plate 66 move downwardly together as a unit. Eventually, the face plate 66 contacts the stock lifter 52 and forces the guides 52 downwardly against the biasing of the spring loading thereof. Thus, the metal strip 12 is also moved downwardly, thereby causing the part 40-2 to enter the recess 82. Just prior to or during such time, a piston and cylinder unit 94 is actuated to extend a support rod 96 (also seen in FIG. 4) into a position to support the carrier strip 14 during insertion of the part 40-2. Still further, downward movement of the stripper 64 causes the pilots 56 to similarly move downward into marginal holes of the carrier strip 14, thus assuring the aperture 26 is precisely aligned with the recess 82.

Thereafter, continued downward movement of the upper die portion 22 causes the punch 62 to punch out the part 40-2 from the arms 42, thereby separating the part 40-2 from the metal strip 12. The part 40-2 then moves downwardly through the recess 82, during which time the part 40-2 is guided by the guides 86 and is inserted into the aperture 26 whereupon the tabs 30 deflect to permit such insertion. Once the holes 46 align with the tabs 30, the tabs 30 return to their original position owing to the resiliency of the plastic used to fabricate the carrier strip 14, thereby inserting such tabs into the holes 46 and thus retaining the part 40-2 in the aperture 26. At this point, the various components are in the position shown in FIGS. 4 and 5.

Following the foregoing sequence of steps, the upper die portion 22 is raised, thereby withdrawing the punch 62 from the recess 82. Eventually, as seen in FIG. 5, the heads 72 of the sub-liner pins 68 contact lower walls 98 of the recesses 74. Continued upper movement of the upper die portion 22 thereafter causes the stripper 64 and the face plate 66 to be moved upwardly as well away from the carrier strip 14. Also during this lifting movement, the piston and cylinder unit 94 is operated to withdraw the support rod 96 from the space between the parts 40-2 and 40-3. Eventually, the components assume the position shown in FIG. 3 whereupon the strips 12 and 14 can be again moved and the foregoing sequence of steps can be repeated to insert the part 40-1 in the next aperture 26 in the carrier strip 14.

As should be evident from the foregoing, the carrier strip 14 will eventually be loaded with parts 40 in the apertures 26. Thereafter, the carrier strip 14 can be rolled up onto reels and delivered to another location whereupon the parts 40 can be removed from the apertures 26. During transport, the parts are securely held in the apertures 26 by the tabs 30. Further, the parts are consistently presented in proper orientation to the assembly apparatus. Thereafter, if desired, the carrier strip can be reused, i.e., loaded with additional parts 40 and again delivered to the assembly location. This reusability is a highly important feature of the present invention and can significantly reduce manufacturing costs. This feature results from the ability of the tabs 30 to deflect and return to their original shape without permanent deformation.

In addition to the foregoing, no secondary labor is required to load parts onto the carrier strip or otherwise perform a finishing operation thereon. Labor costs are low and packaging costs are held to a minimum since no adhesive, cover strips, etc. . . . are used.

As noted above, dimensions of the strips 12 and/or 14 and the tape need not be fabricated of plastic, but instead could be made of any material which is sufficiently resilient to allow the tabs 30 to deflect when a part is inserted into the apertures 26 and so that the tabs subsequently return to an undeflected position and enter a recess in the part 40.

Also as noted above, the dimensions of the strips 12 and/or 14 and the sizes and shapes of the apertures and parts can be varied as needed and still obtain the unique benefits afforded by the present invention. For example, the parts may be circular in cross-section, in which case the apertures 26 may be similarly circularly shaped and include at least one wall portion having at least one tab which is deflectable to engage a recess in the part. Any other cross-sectional part and aperture configuration could alternatively be used, even part and aperture sizes and/or configurations that do not match one another.

Still further, the marginal holes 36, 38 and 48 need not be utilized if some other positioning methodology can be used.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed is:

1. Apparatus for assembling a part carried by a part strip into a resiliently deflectable carrier strip having a part-receiving aperture therein, comprising:

first means for conveying the part strip along a first path to deliver the part to an assembly station;

second means for conveying the carrier strip along a second path transverse to the first path to position the part-receiving aperture at the assembly station; and a punch operative when the part is aligned with the part-receiving aperture at the assembly station for separating the part from the part strip and placing the part in the part-receiving aperture, the punch operating to place the part into the carrier strip by causing the part to deflect the carrier strip during a single punch stroke.

2. The apparatus of claim 1, further including means for positioning the carrier strip.

3. The apparatus of claim 2, wherein the positioning means comprises at least one pilot that extends into a positioning hole in the carrier strip.

4. The apparatus of claim 1, further including means for guiding the part into the part-receiving aperture.

5. A die apparatus for inserting a part carried by a part strip into a resiliently deflectable carrier strip having a part-receiving aperture therein, the apparatus comprising:

a die housing defining an assembly station, a portion of the die housing including a punch generally aligned with the assembly station, the punch being moveable through a punch stroke and being arranged to separate a part from the part strip during the punch stroke and further to cause the part to deflect at least a portion of the carrier strip during the same punch stroke;

a part strip conveyor adapted to convey the part strip to a position adjacent the assembly station; and a carrier strip conveyor adapted to convey the carrier strip to a position aligned with the assembly station;

whereby upon operation of the punch a part is separated from the part strip and inserted into the part receiving aperture of the carrier strip during a single punch stroke.

6. The die apparatus of claim 5, wherein the part strip is conveyed along a first path and wherein the carrier strip is conveyed along a second path transverse to the first path.

7. The die apparatus of claim 5, wherein the housing includes a locator generally aligned with and surrounding the assembly station.

8. The die apparatus of claim 5, wherein the housing includes an upper portion, a lower portion, and an intermediate portion, the upper portion, the lower portion, and the intermediate portion being adapted for relative linear movement.

9. The die apparatus of claim 8, and including a spring disposed between the housing upper and intermediate portions for biasing the upper and intermediate portions away from each other.

10. The die apparatus of claim 8, including a plurality of liner pins extending between the housing intermediate and upper portions.

11. The die apparatus of claim 8, wherein the housing includes a plurality of pilots operatively engaging the lower and intermediate portions, the pilots being adapted to engage the carrier strip to thereby accurately position the carrier strip adjacent the assembly station.

12. The die apparatus of claim 5, wherein the housing includes a lifter guide, the lifter guide including a channel and being adapted to guide the part strip.

13. The die apparatus of claim 5, wherein the housing includes a plurality of pilots, the pilots being responsive to movement of the punch and being adapted to engage the carrier strip to thereby accurately position the carrier strip adjacent the assembly station.

14. A die apparatus for inserting a part carried by a part strip into a carrier strip having a part-receiving aperture therein, the apparatus comprising:

a die housing defining an assembly station, a portion of the die housing including a punch generally aligned with the assembly station, the housing including a support rod, the support rod being moveable between retracted position and a support position in response to operation of the punch, the support rod in the support position being adapted to support a portion of the carrier strip;

a part strip conveyor adapted to convey the part strip to a position adjacent the assembly station; and a carrier strip conveyor adapted to convey the carrier strip to a position aligned with the assembly station;

whereby upon operation of the punch a part is separated from the part strip and inserted into the part receiving aperture of the carrier strip during a single punch stroke.

15. The die apparatus of claim 14, including a piston assembly operatively connected to the support rod and being adapted to shift the support rod between the retracted and support positions.

16. A die apparatus for inserting a part carried by a part strip into a carrier strip having a part-receiving aperture therein, the apparatus comprising:

a die housing defining an assembly station, a portion of the die housing including a punch generally aligned with the assembly station, the housing including a lower portion, and further including a part locator removably attached to the housing lower portion, the part locator being generally aligned with and surrounding the assembly station;

a part strip conveyor adapted to convey the part strip to a position adjacent the assembly station; and a carrier strip conveyor adapted to convey the carrier strip to a position aligned with the assembly station, the part locator being adapted to guide the part into the carrier strip;

whereby upon operation of the punch a part is separated from the part strip and inserted into the part receiving aperture of the carrier strip during a single punch stroke.

* * * * *